(12) United States Patent
Rolff et al.

(10) Patent No.: US 8,293,431 B2
(45) Date of Patent: Oct. 23, 2012

(54) LITHOGRAPHIC MASK AND METHOD OF FORMING A LITHOGRAPHIC MASK

(75) Inventors: Haiko Rolff, Dresden (DE); Carla Byloos, Dresden (DE); Christoph Noelscher, Nuremberg (DE); Nicolo Morgana, Dresden (DE); Roderick Koehle, Ottobrunn (DE); Molela Moukara, Munich (DE); Ralf Neubauer, Bammental (DE); Rainer Pforr, Dresden (DE); Dominique Savignac, Ismaning (DE)

(73) Assignee: Advanced Mask Technology Center GmbH & Co. KG (DE)

( * ) Notice: Subject to any disclaimer, the term of this patent is extended or adjusted under 35 U.S.C. 154(b) by 211 days.

(21) Appl. No.: 12/761,876

(22) Filed: Apr. 16, 2010

(65) Prior Publication Data

US 2010/0266939 A1  Oct. 21, 2010

(30) Foreign Application Priority Data

Apr. 17, 2009 (DE) .......................... 10 2009 017 952

(51) Int. Cl.
*G03F 1/40* (2012.01)
(52) U.S. Cl. .......................................................... 430/5
(58) Field of Classification Search .............. 430/5, 322, 430/323, 394
See application file for complete search history.

(56) References Cited

U.S. PATENT DOCUMENTS

| 5,989,754 | A | 11/1999 | Chen et al. | |
| 8,057,964 | B2* | 11/2011 | Hsu et al. | 430/5 |
| 2004/0229129 | A1 | 11/2004 | Allen et al. | |
| 2010/0112462 | A1* | 5/2010 | Rolfson | 430/5 |

FOREIGN PATENT DOCUMENTS

| JP | 06-266092 | 9/1994 |
| JP | 2008-191277 | 8/2008 |
| JP | 2010-206177 | 9/2010 |

* cited by examiner

*Primary Examiner* — Stephen Rosasco
(74) *Attorney, Agent, or Firm* — Mayback & Hoffman, P.A.; Gregory L. Mayback; Rebecca A Tie

(57) ABSTRACT

A lithographic mask comprises a first layer including grooves, a second layer including regions, sections and a groove-like structure that encloses the sections. The first and second layers are formed so as to reduce electrical potential differences within the second layer. A method of forming a lithographic mask includes forming first and second layers to dispose the second layer over the first layer, patterning the second layer to comprise sections, a region, and a groove-like structure enclosing the sections, and forming grooves in the first layer at portions not covered by the second layer. The first and second layers are formed to reduce potential differences within the second layers during the step of forming the grooves in the first layer.

23 Claims, 10 Drawing Sheets

LITHOGRAPHIC MASK AND METHOD OF FORMING A LITHOGRAPHIC MASK

STATEMENT REGARDING FEDERALLY SPONSORED RESEARCH OR DEVELOPMENT n/a

FIELD OF THE INVENTION

The present specification relates to a lithographic mask for the manufacture of semiconductor devices.

BACKGROUND OF THE INVENTION

For manufacturing patterns and features having a small feature size, so-called alternating phase shift masks, half-tone masks or 3-tone masks are increasingly used. For example, an alternating phase shift mask may comprise a quartz substrate and a patterned absorbing layer. For example, half-tone and 3-tone masks may comprise a quartz layer, an absorbing layer and a further semi-transparent layer between the quartz layer and the absorbing layer.

An alternating phase shift mask, a half-tone mask or a 3-tone mask may be manufactured by a process according to which, in a first processing layer, the absorbing layer that also may have function of a hard mask is patterned in accordance with a mask layout. In a second processing layer, the phase shifting patterns are etched in the quartz layer to form the phase shift mask. For example, for manufacturing the half-tone mask, the semitransparent layer is patterned, and for manufacturing the 3-tone mask, the semitransparent layer and the quartz layer are patterned.

During the manufacture of semiconductor devices, a single semiconductor wafer may be processed to form hundreds of integrated circuits, semiconductor devices, or microchips at a time. After terminating the wafer-wise processing, the microchips are isolated. Cracks may occur during this isolation process. These cracks may migrate into the active region of the microchip and may damage the chip or even destroy it. Further, moisture may penetrate into the insulating layer or ions may migrate into gate structures of transistors forming part of the microchip, which may be a danger for the functionality and reliability of the microchip. Accordingly, usually a barrier structure is provided that annularly encloses the chip and may comprise two closed rings. The outer ring (e.g., crack stop) may protect the chip from penetrating cracks and the inner ring (e.g., guard ring) may protect the chip from migrating humidity and ions. Usually, further patterns, such as representing adjustment marks or test structures, are disposed outside the outer ring in the kerf region of the single microchip.

When manufacturing masks utilizing different lithographic layers, problems may arise during the manufacture of patterns that are disposed inside or outside the barrier structure. These problems may be due to the closed barrier structure in the second processing layer. For example, patterns inside the barrier structure may be etched at a different rate than patterns outside the barrier structure. For example, this may be due to different charging states of different regions that are insulated from each other by the closed barrier structure.

FIG. 1 shows an example of a layout 1000 for an alternating phase shift mask. The alternating phase shift mask may comprise a transparent quartz layer and a patterned opaque chromium layer. In FIG. 1, non-hatched areas refer to transparent non-phase shifting quartz regions and hatched portions represent opaque chromium regions. A transparent groove-like pattern 2000 that leaves portions of the quartz layer uncovered insulates sections 3220 from each other as well as from larger regions 3210 of chromium. For example, patterns forming a microchip may be disposed in the sections 3220. For example, when manufacturing masks during which different processing layers are patterned (for example during the manufacture of alternating phase shift masks, the half-tone mask, or the 3-tone mask), a different charging of the sections 3220 and the region 3210 may occur, for example, during a plasma etching process. Hence, potential differences in the patterned opaque layer of chromium may be generated. The resulting electric fields may change the kinetic energy and concentration of ions during the plasma etching process, the ions substantially pertaining to the etching process. As a result, an inhomogeneous etching rate may be generated within the mask surface.

FIG. 2 shows an example of the cross-section of a known alternating phase shift mask 3000. As shown in this figure, the inhomogeneity of the etching rate may result in different depths of the grooves 330. The alternating phase shift mask 3000 comprises a transparent first layer 310 that may be formed of quartz, and a second opaque layer 320 that may be made of chromium. The opaque second layer 320 is patterned in a first processing layer according to a mask layout. Hence, the second layer 320 will be partially removed, whereby transparent portions are formed in which portions of the quartz substrate are uncovered and opaque portions of the mask are formed. In a second processing layer, the partially uncovered first layer 310 of quartz is further patterned. To this end, grooves 330 are etched into the quartz substrate, utilizing the second layer 320 as a hard mask layer. The depth of the patterned grooves 330 is controlled such that, during an exposure step of an imaging process, the phase of light that passes through the grooves 330 will be shifted by 180 degree with respect to light that passes through the unetched quartz substrate. In this respect, the term "alternating" means that phase shifting (180°) and non-phase shifting patterns (0°) are alternatively disposed. For example, in a line-space pattern, an enhanced contrast of the exposure may be attained due to the alternating phase shifting configuration. The depth of the phase shifting grooves 330 should be set with a high precision in order to improve enhancement of the contrast. As is, for example shown in FIG. 2, the grooves 330 that may be formed by a processing resulting in an inhomogeneous etching rate, may have different depths, wherein the depth of the grooves 330 depends from the size and the removal of conductive portions in the second layer 320. Accordingly, too strong variations of the etch depth of phase shifting grooves 330 may result in a deterioration of the mask.

SUMMARY OF THE INVENTION

Although the invention is illustrated and described herein as embodied in a lithographic mask and method of forming a lithographic mask, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward.

Before the present invention is disclosed and described, it is to be understood that the terminology used herein is for the purpose of describing particular embodiments only and is not intended to be limiting. The terms "a" or "an", as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically.

As used herein, the term "about" or "approximately" applies to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure.

Features and advantages of embodiments of the invention will be apparent from the following description of the drawings. Emphasis is placed upon illustrating the principles. The drawings are not to scale. Features of the embodiments may be combined with each other unless they exclude each other.

DETAILED DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION OF THE INVENTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the figures being described. Because components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

Figure 3A:
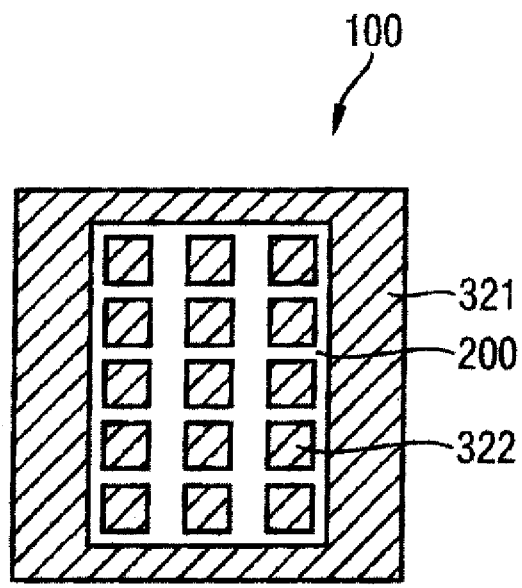
FIG. 3A is a plan view of a mask layout according to an exemplary embodiment of the invention.

FIG. 3A shows an example of a layout 100 for an alternating phase shift mask. The alternating phase shift mask may comprise a transparent quartz layer and a patterned opaque chromium layer. In FIG. 3A, non-hatched areas refer to transparent non-phase shifting quartz regions and hatched portions represent opaque chromium regions. A transparent groove-like pattern 200 that leaves portions of the quartz layer uncovered may separate sections 322 from each other as well as from larger regions 321 of chromium. For example, patterns forming a microchip may be disposed in the sections 322.

Figure 3B:
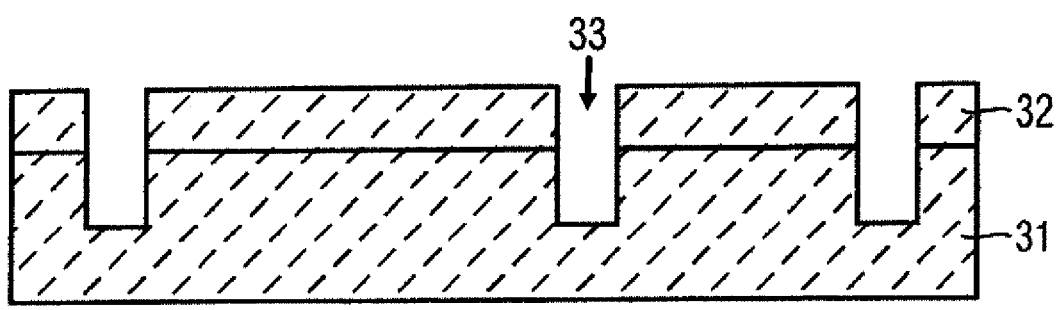
FIG. 3B is a cross-sectional view of a lithographic mask according to an exemplary embodiment of the invention.

FIG. 3B shows an example of the cross section of the alternating phase shift mask 300 illustrated in FIG. 3A. As shown in this figure, a lithographic mask 300 may comprise a first layer 31 including grooves 33, a second layer 32 including a region 321, sections 322 and a groove-like structure 200 that encloses the sections 322, the first and the second layer being formed in such a manner to reduce electrical potential differences within the second layer 32. The groove-like structure 200 may be implemented by a groove formed in the second layer so as to leave portions of the first layer uncovered. If the first layer is made of a transparent material, the groove-like structure may form a transparent structure. The second layer 32 may comprise more than one region 321.

The alternating phase shift mask 300 may comprise a transparent first layer 31 and a second opaque layer 32 that may be of chromium. The opaque second layer 32 is patterned in a first processing layer according to a mask layout. Hence, the second layer 32 will be partially removed, whereby transparent portions are formed in which portions of the quartz substrate are uncovered and opaque portions of the mask are formed. In a second processing layer, the partially uncovered first layer 31 is further patterned. To this end, grooves 33 are etched into the first layer 31, utilizing the second layer 32 as a hard mask layer. The depth of the patterned grooves 33 is set such that, during an exposure step of an imaging process, the phase of light that passes through the grooves 33 will be shifted by 180 degrees with respect to light that passes through the unetched quartz substrate. For example, in a line-space pattern, an enhanced contrast of the exposure may be attained due to the alternating phase shifting configuration. As is shown in FIG. 3B, the grooves 33 formed in the first layer 31 may be disposed beneath the grooves that are formed in the second layer 32.

For example, the material establishing the first layer 31, in which the grooves are to be etched, as well as the second layer 32 may comprise materials having the same conductivity. Thereby, for example, a different charging of the regions 321 and sections 322 in the second layer 32 that may act as a hard mask during the etching process of the first layer may be a largely avoided. As a result, the charging and potential differences in the second layer 32 may be avoided. Consequently, homogeneous etching rates and identical etching depths of the grooves 33 may be obtained.

In the context of the present invention, reference to a "processing layer" is made. This term refers to a method of manufacturing a specific structure comprising several layers that may be disposed over each other. The term "processing layer" refers to a processing step in which a specific layer is processed. Thereafter, for example, a further layer may be formed over the processed layer and this further layer may be processed. Alternatively, the upper layer may be processed in a first processing layer, followed by a processing of the portions that are uncovered due to the first processing layer.

According to one exemplary embodiment, the first and the second layer 31, 32 may be made of an insulating material. Examples of the material comprise crystalline $SiO_2$, or diamond-like carbon. According to a further embodiment, the first layer 31 and the second layer 32 may comprise a conductive material. Examples of the material of the first layer may be conductive molybdenum silicide or doped $SiO_2$. As becomes apparent from the embodiments described herein, the embodiments relate to any kind of masks, for example, lithographic masks that comprise two or more layers. Examples comprise alternating phase shift masks, half-tone masks, and 3-tone masks. For example, the half-tone and the 3-tone mask is a phase shift mask comprising a semitransparent layer, e.g., of molybdenum silicide, that may be disposed between the transparent and the opaque layer. In the second processing layer of the manufacture of the half-tone mask, the semitransparent layer is patterned to form phase shifting, semitransparent and non-phase shifting, transparent portions in the mask. Further examples comprise lithographic masks comprising a reflecting layer stack such as a EUV mask.

According to a further exemplary embodiment, the separating structure 200 formed in the second layer may be constituted such that no or almost no potential differences are generated between the sections 322 and the regions 321 that are formed in the second layer and are isolated from each other by the separating structure 200.

Figure 4:
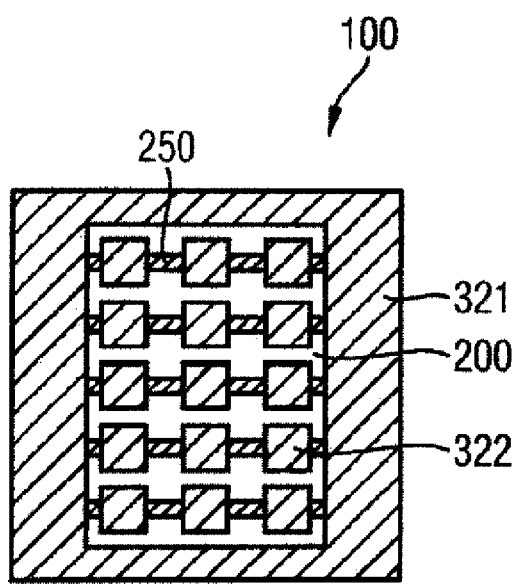
FIG. 4 is plan view of a mask layout according to a further exemplary embodiment of the invention.

FIG. 4 shows an example according to this embodiment. FIG. 4 illustrates a mask layout 100 comprising opaque sections 322 that are enclosed by a transparent separating structure 200. The separating structure 200 comprises interrupting regions 250. Due to these interrupting regions 250, which may be formed of the material of the second layer 32, for example chromium, the sections 322 are not insulated from the larger opaque regions 321. To be more specific, the interrupting regions 250 electrically connect the sections 322 and the regions 321 with each other. Thereby, the sections 322 and the regions 321 will be charged at an approximately equal rate, whereby potential differences in the second layer 32 may be avoided. The interrupting regions 250 may be formed so that they will not be printed onto the semiconductor wafer during a lithographic step. Nevertheless, according to a further exemplary embodiment, the interrupting regions 250 may as well be printed on the semiconductor wafer.

In the following, embodiments including a separating structure 200 comprising non-printing interrupting regions 250 or printing interrupting regions 250 will be illustrated with respect to a barrier structure.

Figure 5:
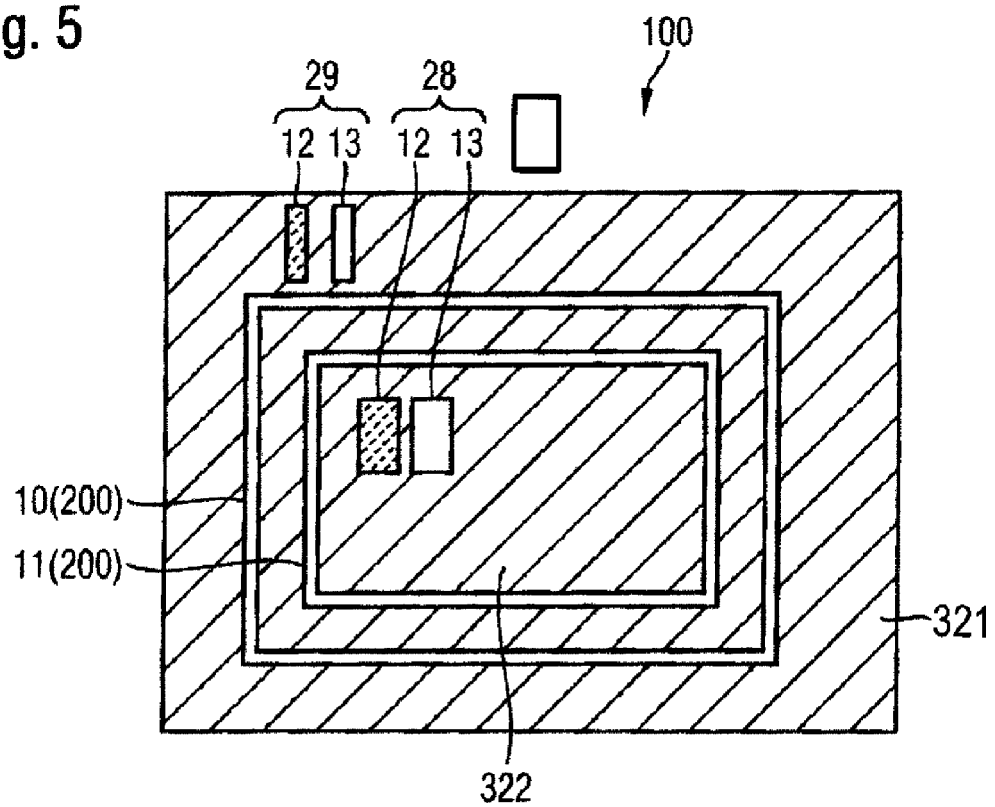
FIG. 5 is a fragmentary, plan view of a portion of a conventional mask layout comprising a barrier structure according to an exemplary embodiment of the invention.

FIG. 5 shows a mask layout 100 of an alternating phase shift mask or a half-tone mask comprising a separating structure 200 that encloses the section 322. In FIG. 5, hatched portions comprising solid lines represent the second layer 32 and form dark, opaque portions in the mask. Broken lines represent phase-shifting portions, being etched in the first layer 31 of quartz with respect to an alternating phase shift mask or semitransparent, phase-shifting portions of molybdenum silicide with respect to the half-tone mask. Non-hatched portions represent non phase-shifting, transparent portions in the mask, i.e., those portions in which the mask substrate, that may be made of quartz, is uncovered. The absorber layer or hard mask, that is made of chromium, may be still present in the opaque regions, whereas the absorber layer may be removed in all other portions. The separating structure 200 comprises an outer frame or ring 10 that is to be printed onto a substrate or semiconductor wafer during a lithographic step. For example, this outer ring 10 may be printed onto the semiconductor wafer to form a barrier structure that protects the first section 322. For example, this protecting barrier structure or crack stop may protect patterns or devices in the semiconductor wafer from cracks that may be formed during the dicing process. The inner frame or ring 11 that is printed onto the semiconductor wafer protects the section 322 from penetrating moisture and migrating ions in the semiconductor wafer, thus forming a guard ring. For example, the mask layout 100 shown in FIG. 5 may comprise the mask pattern 28 that may include phase shifting structures 12 and transparent structures 13 that may be printed to form microchips or semiconductor devices. Moreover, further phase-shifting structures 12 and transparent structures 13 may be disposed outside the outer ring 10 of the separating structure 200 in the region 321 to form a further mask pattern 29.

Continuous transparent portions that surround the section 322, such as the separating structure 200, may result in an electric insulation of the section 322 in the photomask. Thereby, charging effects during mask manufacturing, for example, during the mask exposure process/beam writing process and the etching process, may be generated. For example, these charging effects may occur in the second processing layer. The hard mask may have been already patterned in the first processing layer to insulate the section 322. When phase shifting structures are etched into the first layer in order to form an alternating phase shifting mask, charging effects may occur. Likewise this may also occur with respect to the half-tone mask when a semitransparent layer is patterned in the second processing layer. Because the charging of the sections 322 and the region 321 is different, different etching depths in quartz in sections 322 as well as in region 321 may occur as has been experimentally shown for a line-space pattern as well as for a contact hole pattern. Accordingly, the critical dimensions ("CD") of the lines may largely vary in the semiconductor wafer that has been formed by a lithographic process using the mask.

Further, due to the different charging state of the section 322 and the region 321, different etching depths in the quartz layer may be obtained when etching phase-shifting structures in the section 322 as well as in the region 321 of the photomask. For example, one single etching process may result in an average etching depth in quartz of 169.6 nm in the region 321 and in an average etching depth in quartz of 174.3 nm in the section 322. Accordingly, the average etching depths vary to such an amount that they do not lie within a predetermined interval of tolerance.

Figure 6:
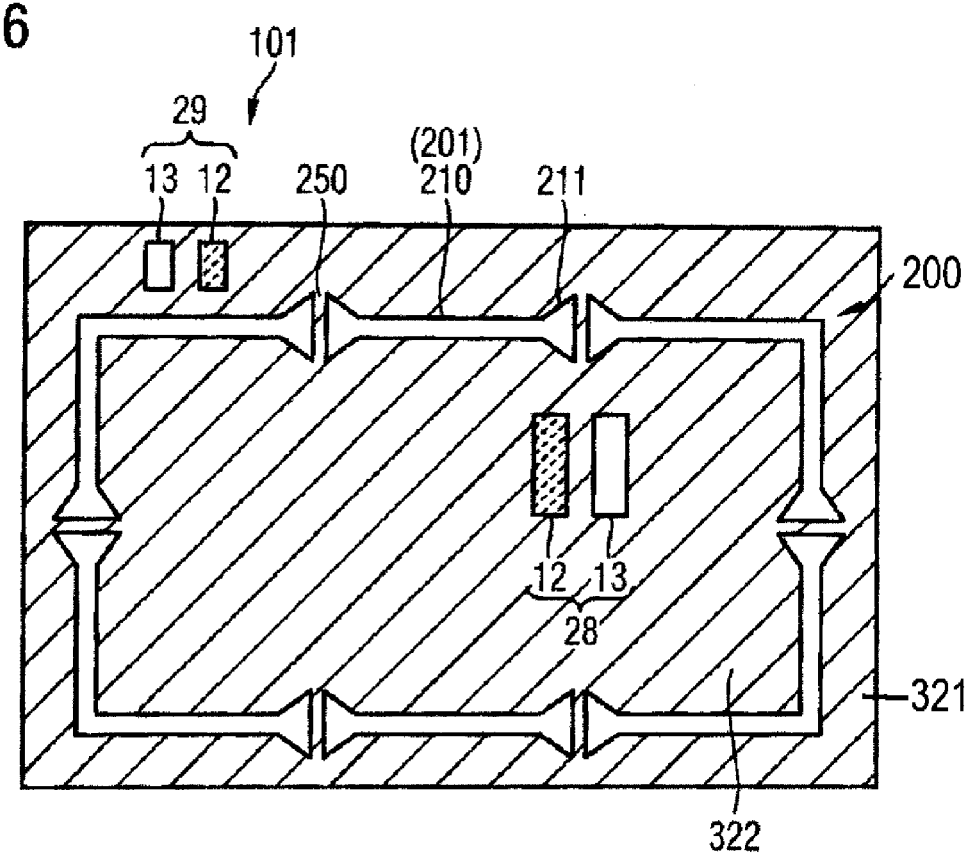
FIG. 6 is a fragmentary, plan view of a mask layout according to an exemplary embodiment of the invention comprising a structure according to the invention that may be used for patterning a barrier structure.

FIG. 6 shows a portion of a layout of a photomask 101 according to a further exemplary embodiment in which the separating structure 200 is not continuous but comprises interrupting regions 250. The photomask may be, for example, an alternating phase shift mask comprising opaque and transparent as well as transparent, phase shifting patterns, or a half-tone mask or a 3-tone mask including additional semitransparent patterns. By way of example, the photomask may as well be a chrome-less photomask including transparent and phase shifting patterns or a reflecting photomask for a EUV exposure step.

In FIG. 6 and the following figures, transparent portions of the mask are unhatched, opaque portions are hatched with solid lines, and phase shifting portions are hatched with broken lines. As is shown, the groove-like separating structure 200 may be implemented by grooves formed in the second layer 32. This separating structure 200 encloses the section 322 including the first mask pattern 28 comprising transparent 13 and phase shifting patterns 12. The separating structure 200 comprises first segments 210 (201), having the shape of a line or a groove, the first segments comprising a broadening portion 211 at their ends. A non-printing interrupting region 250 is disposed between the broadening portions 211 of two neighboring first segments 210 (201). The section 322 is connected with the region 321 via the interrupting region 250. The interrupting region 250 may be made of a material of the second layer 32.

In the context of the present invention, the separating structure 200 is referred to as being "groove-like" or "line-like." As is clearly to be understood, the term "groove-like" or "line-like" refers to the shape of this structure extending into one direction and, thus, forming a approximately one-dimensional structure (when neglecting the groove-width or line-width) instead of an area extending into two directions. Nevertheless, as is also to be clearly understood, this approximately one-dimensional structure may form a ring or the contour of a rectangle or any other suitable shape. The separating structure may, for example, be formed by etching a groove into the second layer 32. Alternatively, the separating structure may as well be a protruding structure which may be formed by forming the second layer and etching all the portions of the second layer without those portions that are to form the line-like separating structure 200.

Due to the connection, different charging states between the section 322 and the region 321 in the second layer are avoided. The second mask pattern 29 in the region 321 may be patterned under the same conditions as are prevailing in the section 322.

For manufacturing an alternating phase shift photomask, an absorber layer may be formed over a transparent mask substrate. The absorber layer may be patterned according to a mask layout. Thereby, the first pattern 28 and the separating structure 200 may be formed in the absorber layer in a first processing layer. For example, the separating structure 200 may have a line-like or groove-like shape and comprise the interrupting regions 250. The separating structure 200 may enclose the first pattern 28. In a second processing layer, phase shifting grooves may be formed in the mask layer substrate, for example, by etching.

When manufacturing the half-tone mask, a semitransparent absorber layer is disposed between the absorber layer and the mask substrate. According to the method for forming the half-tone mask, the semitransparent absorber layer is patterned in the second processing step.

For the alternating phase shift photomask comprising the separating structure including interrupting regions as has been described above, it has been shown that the average etching depths in the section 322 as well as in the region 31 lie within the interval of tolerance. For example, in the region 321, an average of the etching depth in quartz of 172 nm was obtained and, in the section 322, an average of the etching depth in quartz of 172.2 nm has been obtained. Accordingly, the difference was considerably small.

Figure 7:
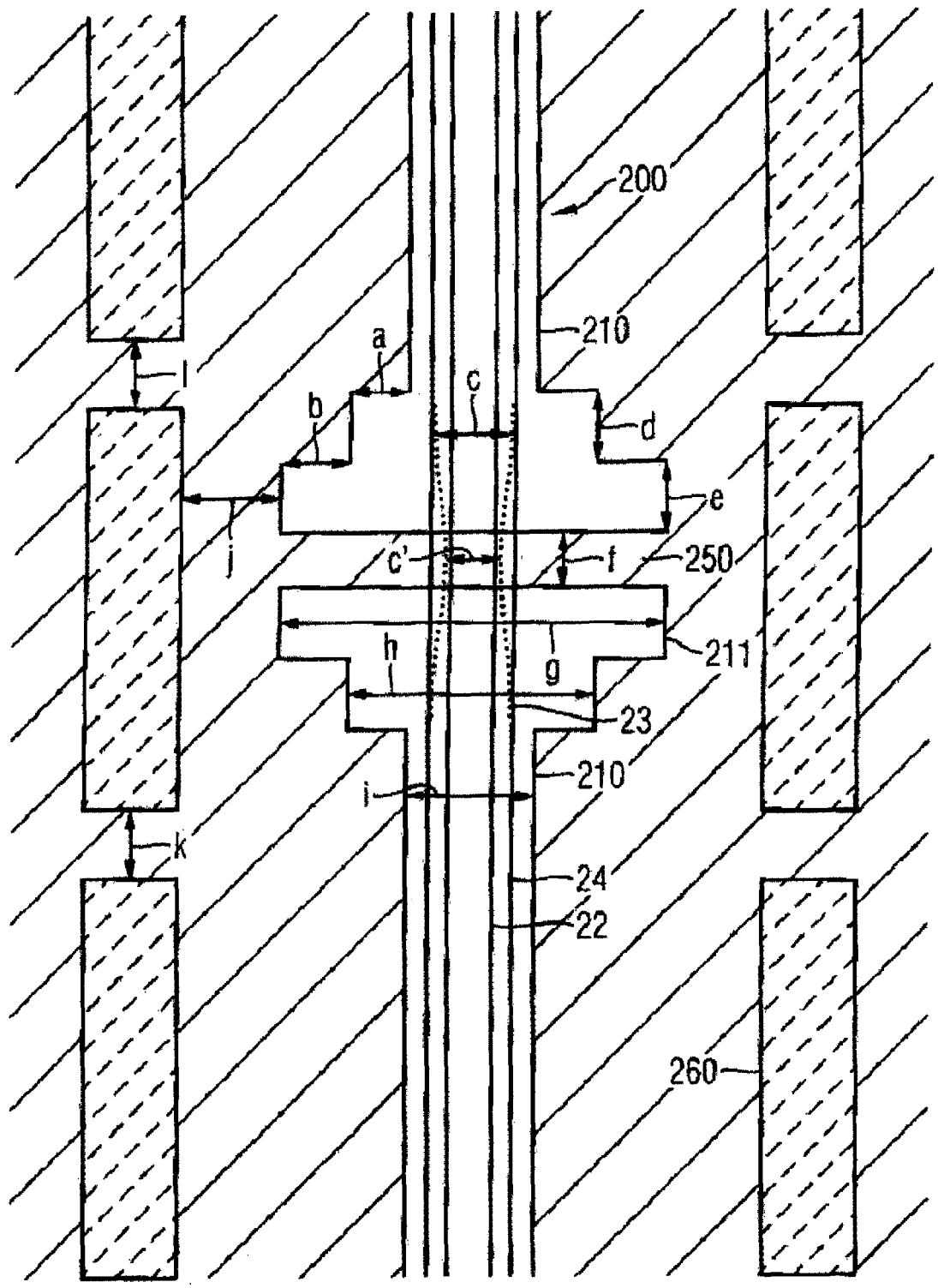
FIG. 7 is a fragmentary, plan view of an exemplary embodiment of a mask design according to the invention comprising the structure in a portion of non-printing interrupting regions.

FIG. 7 shows a mask design according to an exemplary embodiment of the invention. According to this exemplary embodiment, the separating structure 200 may be formed as a non-continuous separating structure including a broadening portion 211 that is formed as a two-stepped broadening portion. FIG. 7 shows two neighboring first segments 210, the two-stepped broadening portions 211 as well as the non-printing interrupting region 250 that is disposed between the two separating structures 200. As is to be understood, the broadening portions 211 may as well have a different shape. To be more specific, they may be a single-stepped broadening portion or comprise more than two steps. The broadening portion 211 may as well be formed without steps. The first segment 210 has the shape of a line and comprises the broadening region 211 on at least one end thereof. The sizes of the broadening regions 211 and the interruption region 250 may be chosen such that they compensate for each other when being subject to a lithographic process. As a consequence, neither the broadening portions 211 nor the interrupting region 250 will be printed onto a substrate to be processed. For example, FIG. 7 shows a wafer target pattern 24 as well as a design target pattern 22. The dotted line shows a simulated target pattern 23 on the substrate that results from a simulation of a lithographic step using the structure 200. As can be seen, the simulated target pattern 23 is continuous and does not comprise any interrupting regions. At a portion of the interruption region 250, the simulated target pattern 23 deviates from the wafer target pattern 24 that is to be obtained in the substrate 24. The simulated target pattern 23 comprises a bottle neck at the portion of the interrupting region. Accordingly, when being imaged onto the substrate, the line width deviates from the targeted line width. Phase shifting assist patterns 260 may be disposed next to the separating structure 200. The hatchings of FIG. 7 are as described above with reference to FIG. 6.

The following list contains examples of the dimensions shown in FIG. 7: a=0.03 µm, b=0.04 µm, c=0.11 µm, d=0.03 µm, e=0.05 µm, f=0.035 µm, c'=0.073 µm, g=0.31 µm, h=0.23 µm, i=0.170 µm, j=0.045 µm, k=0.041 µm, l=0.04 µm.

Figure 8:
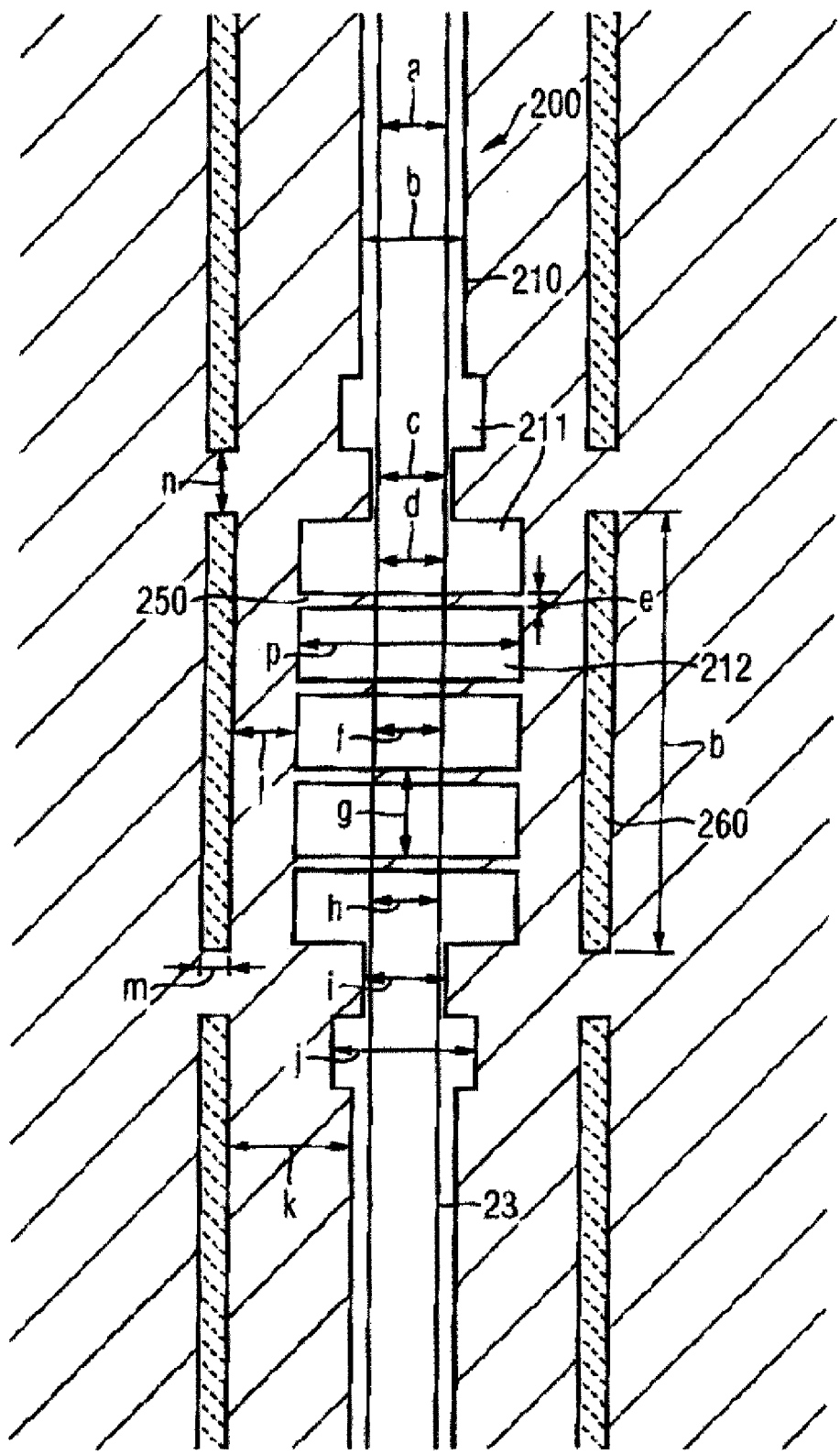
FIG. 8 is a fragmentary, plan view of a further exemplary embodiment of a mask design according to the invention comprising the structure in a portion of non-printing interrupting regions.

FIG. 8 shows a mask design according to a further embodiment. Second segments 212 may be disposed between two first segments 210. As is shown in FIG. 8, up to three second segments 212 may be disposed between two first segments 210. Nevertheless, more than three or only one or two further second segments 212 may as well be disposed between two first segments. The first segments 210 may have the shape of a line comprising a broadening region 211 at one end thereof. The broadening portions 211 may comprise two or more parts. Interrupting regions 250 are disposed between the single segments 210, 212. The dimension of the second segments 212 and the broadening regions 211 as well as of the diameter of the interrupting regions 250 may be chosen such that the interrupting regions 250 as well as the broadening regions 211 will not be printed onto the substrate. Non-printing, phase shifting assist structures 260 may be disposed next to the separating structure 200. The assist structures 260 may increase the contrast and the depth of focus of the image. For example, they may be continuous in a region, in which also the interrupting regions 250 exist. For example, the assist structures 260 may also comprise interrupting portions, these interrupting portions being disposed at a distance from the interrupting regions 250.

For example, the separating structure 200 may comprise only the segments 212 that are separated from each other by the interrupting regions 250. The second segments may have a rectangular shape. Nevertheless, any other suitable shape, for example, a parallelogram having an angle of 45° may be used.

According to an exemplary embodiment, the diameter of the interrupting region may be chosen such that it is smaller than a limit of resolution of the imaging device so that the interrupting region will not be printed onto the substrate.

FIG. 8 shows a simulated target pattern 23 on the substrate. As will be readily appreciated, the simulated target pattern 23 of FIG. 7 does not have variations of the CD (critical dimension). To be more specific, the variations of the CD are not perceivable.

According to an exemplary embodiment, the patterns shown in FIG. 8 may have the following dimensions: a=0.1090 µm, b=0.165 µm, c=0.107 µm, d=0.106 µm, e=0.03 µm, f=0.11125 µm, g=0.165 µm, h=0.105 µm, i=0.148 µm, j=0.191 µm, k=0.0975 µm, l=0.055 µm, m=0.06 µm, n=0.065 µm, o=0.78 µm, p=0.25 µm.

Figure 9:
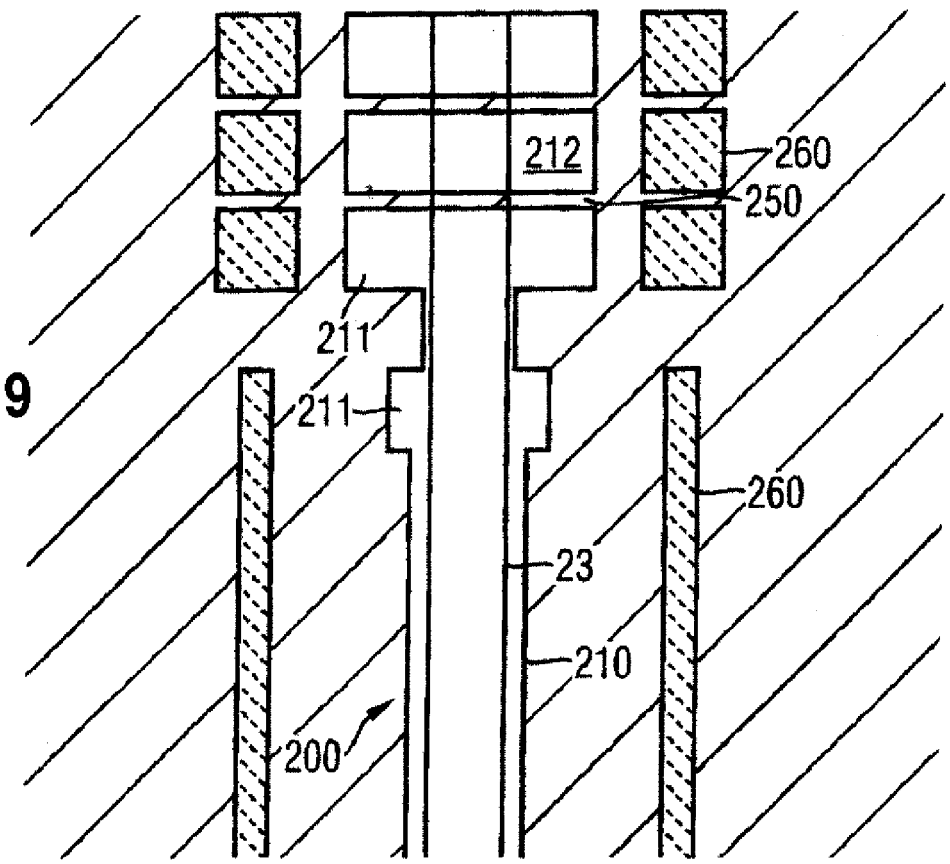
FIG. 9 is a fragmentary, plan view of a mask design for the structure shown in FIG. 4 according to a further exemplary embodiment of the invention.

FIG. 9 shows an enlargement of the interrupting region according to an exemplary embodiment. As is shown, the assist structures 260 may include interrupting portions that are disposed in the vicinity of the interrupting regions 250. For example, the distances a and b may be 0.05 µm.

The embodiments shown in FIGS. 8 and 9 as well as an embodiment, in which the separating structure 200 is formed so as to comprise only second segments 212, may result in a pattern formed in a substrate, the pattern comprising lines or grooves that are continuous and have only small or no CD variations.

Further embodiments may, for example, comprise two neighboring interrupting regions having a pitch that will not be printed. In the context of the present invention, the pitch refers to the sum of the second segment and the interrupting region. The minimal printable pitch of a non-alternating grating as given by a resolution limit $\lambda/(NA(1+sigma))$ of the imaging system, wherein $\lambda$ denotes an imaging wavelength and NA refers to the numerical aperture of the system. For example, for $\lambda$=193 nm and NA=0.93, the minimal pitch=167.3 nm under the assumption of equal phase openings and coherent illumination. Utilizing oblique illumination, as is the case when using a reflection mask, the pitch is reduced. The example given above is optimized for a fill factor sigma=0.24.

The embodiments of the photomask shown, wherein the photomask comprises non-continuous separating structure, are printed onto the semiconductor wafer to form a continuous pattern and are adapted to form a barrier structure that may protect the printed first pattern on the semiconductor wafer. For example, it may refer to a lithographic mask for defining a contact hole layer.

Figure 10:
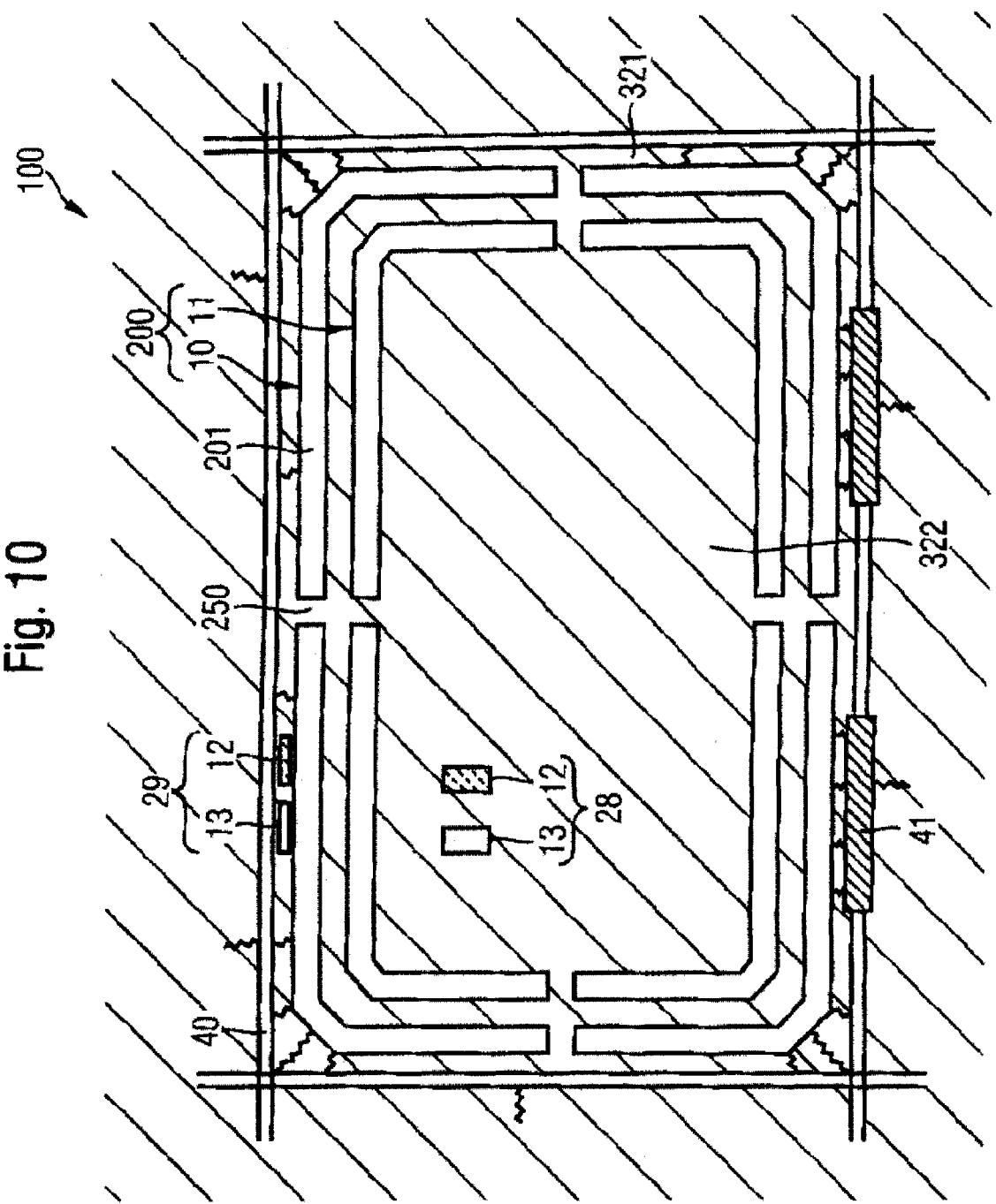
FIG. 10 is a fragmentary, plan view of an exemplary embodiment of a mask layout according to the invention comprising the structure including printing interrupting regions.

FIG. 10 shows a schematic mask layout 100 according to a further embodiment. As can be seen, the section 322 is enclosed by the separating structure 200. The first pattern 28 comprising phase-shifting portions 12 and transparent structures 13 are disposed within the section 322. For example, the first pattern 28 may form a microchip in the semiconductor wafer. The separating structure 200 comprises the outer ring 10 and the inner ring 11. The second pattern 29 is disposed within the region 321 outside the outer ring 10. A kerf 40 is disposed so as to separate adjacent regions 321 from each other. For example, the microchips are isolated by dicing along the kerf 40. The outer and the inner ring (10, 11) may form a barrier structure in the semiconductor wafer. The outer barrier structure (crack stop) protects the microchip from cracks penetrating into the chip area that may occur when dicing the microchips. These cracks are indicated by jagged lines at the corners of the microchip in FIG. 10. The inner barrier structure (guard ring) protects the chip area from penetrating moisture and migrating ions.

The interrupting regions 250, that may be printable onto a semiconductor wafer of the separating structure 200 are disposed at a portion being distant from corners and large metallic areas 41, since the probability of cracks is higher in a region of a corner or the metallic regions 41 than in other regions. Due to the position of the interrupting regions 250 being distant from the corners and the large metallic areas 41, the protecting function of the barrier structure may be provided in the semiconductor wafer. As is shown in FIG. 10, four interrupting regions 250 may be present. As is be readily to be understood, it is also possible to provide more interrupting regions, for example eight or sixteen interrupting regions. In the embodiment shown in FIG. 10, the section 322 and the region 321 are electrically connected with each other. If an alternating phase shift or half-tone mask is manufactured, unwanted different charging states in the sections 322 and the region 321 may not occur.

Figure 11:
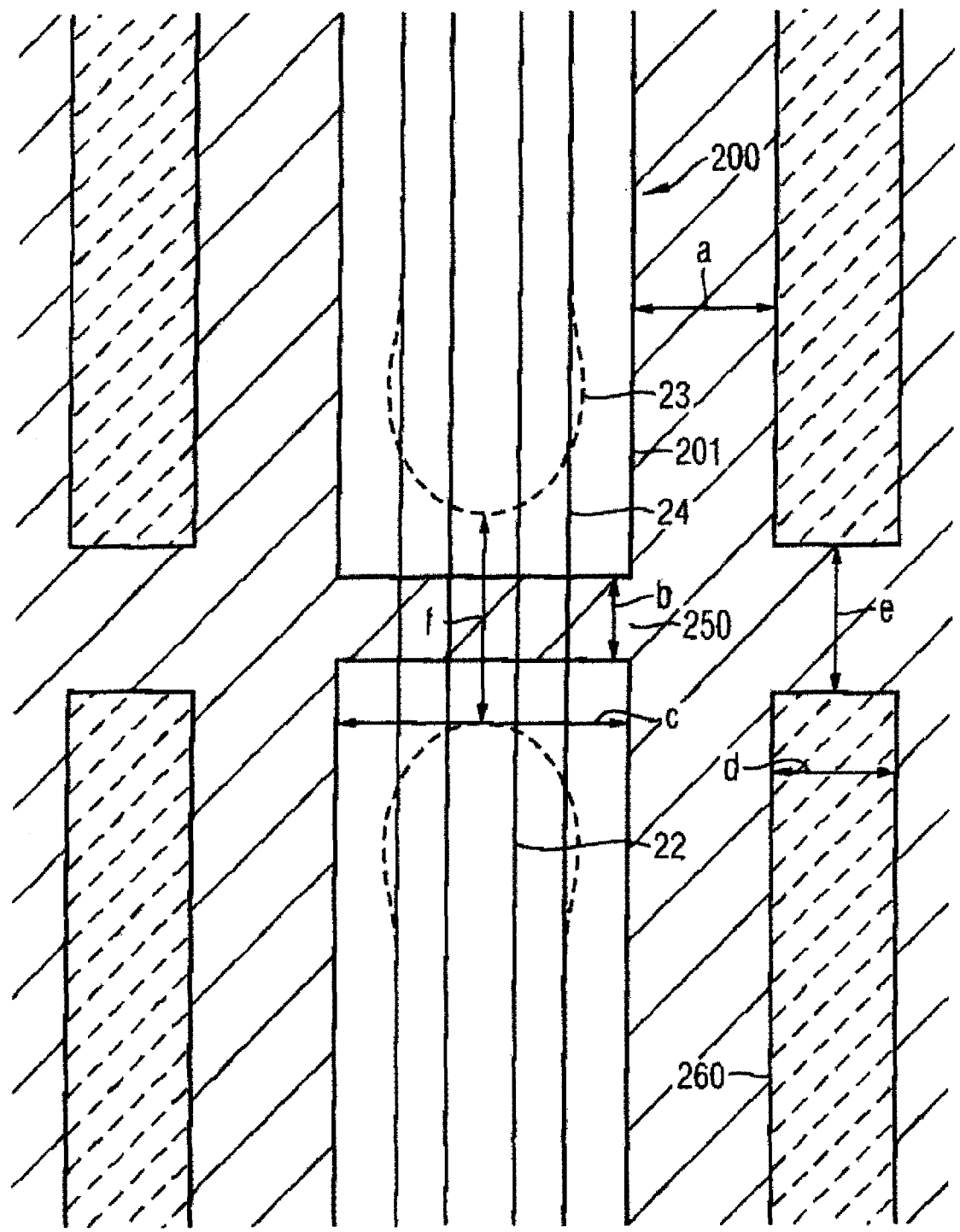
FIG. 11 is a fragmentary, plan view of an exemplary mask design according to the invention comprising the structure according to FIG. 10 in a portion of printing interrupting regions.

FIG. 11 shows an example of a mask design for two segments 201 of the structure 200 shown in FIG. 10 in a region of the printing interrupting region 250. According to this example, the separating structure 200 is a non phase-shifting transparent pattern. Phase-shifting assist structures 260 are disposed in the vicinity of the separating structure 200. Reference numeral 22 denotes the design target pattern and reference numeral 24 denotes the wafer target pattern. The broken line refers to the simulated target pattern 23 on the substrate. As can be readily recognized, the simulated target pattern 23 is different than the wafer target pattern 24 in a portion of the printing interrupting regions 250. Other than the wafer target pattern 24, the simulated target pattern 23 comprises the interrupting region, and, in addition, the corners of the segments 210 are shortened and rounded, in comparison to the separating structure 200.

According to an exemplary embodiment, the dimensions shown in FIG. 11 may have the following values: a=0.105 µm, b=0.105 µm, c=0.170 µm, d=0.080 µm, e=0.070 µm.

Figure 12:
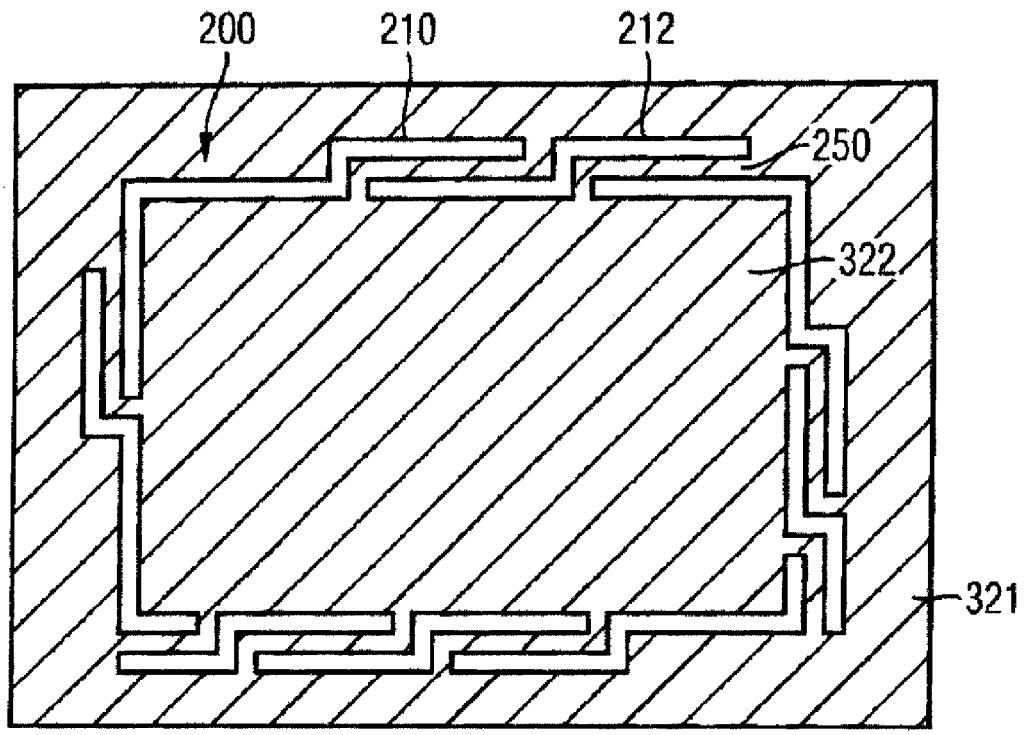
FIG. 12 is a fragmentary, plan view of an exemplary embodiment of a mask layout according to the invention including the structure comprising printing interrupting regions.
Figure 13:
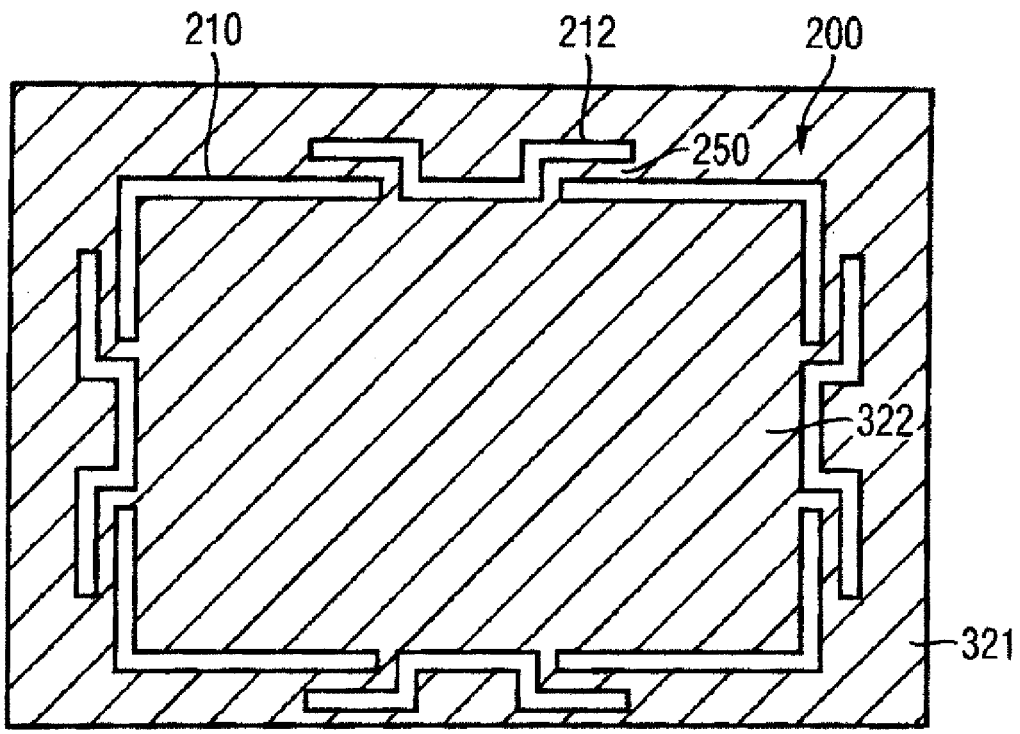
FIG. 13 is a fragmentary, plan view of an exemplary mask layout comprising the structure including printing interrupting regions according to a further exemplary embodiment according to the invention.

FIGS. 12 and 13 show further embodiments of the separating structure 200 comprising printing interrupting regions 250, that enclose the section 322. As is shown in FIGS. 12 and 13, the interrupting regions 250 may have a labyrinth-like shape. In these figures, the separating structure 200 may comprise several segments. For example, as is shown in FIG. 12, the segments may comprise step-like first segments 210 and step-like second segments 212 that are disposed in an interleaving manner so that a path from the region 321 to the section 322 is labyrinth-like. If the separating structure 200 is printed onto a semiconductor wafer, the resulting structure will comprise labyrinth-like interrupting regions 250. Due to the special shape of the interrupting regions 250, the separating structure 200 that encloses the section 322 may form a barrier structure on the patterned semiconductor wafer that protects the first pattern 28 of the section 322 from penetrating cracks or migrating ions. The protecting function has been experimentally shown.

A further exemplary embodiment of the separating structure 200 comprising labyrinth-like interrupting regions 250 is shown in FIG. 13. The separating structure 200 comprises line-like or groove-like first segments 210. They are disposed in the manner so that they enclose the section 322 and are separated from each other by a large gap. A step-like second segment 212 is disposed in the large gap. As a result, the large gap is partially closed, a labyrinth-like interrupting region 250 being remaining, the interrupting regions having similar properties as the interrupting region 250 shown in FIG. 12.

Figure 1:
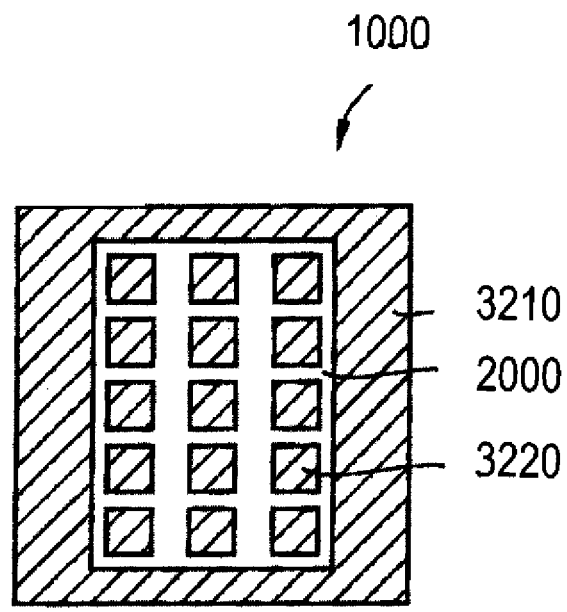
FIG. 1 is a diagrammatic illustration of an exemplary conventional mask layout.
Figure 2:
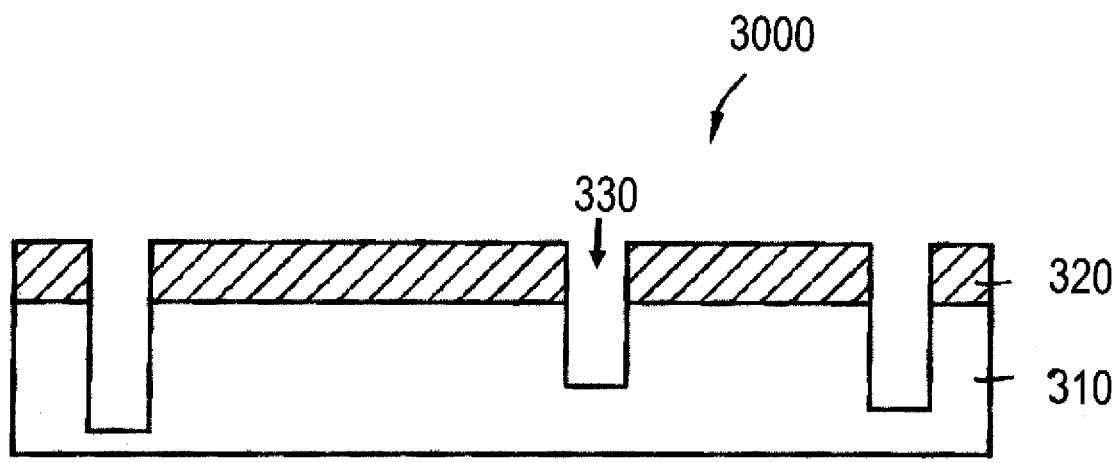
FIG. 2 is a fragmentary, cross-sectional view of a portion of the lithographic mask of FIG. 1.
Figure 14:
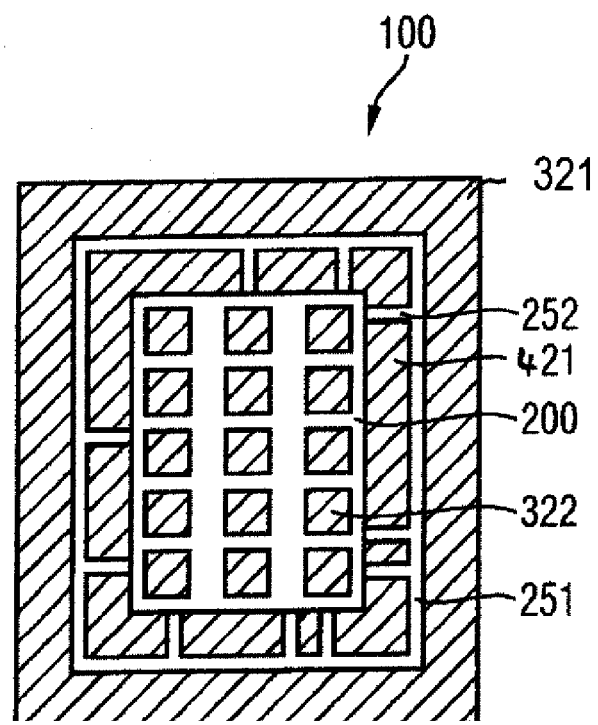
FIG. 14 is a fragmentary, plan view of a mask layout according to still a further exemplary embodiment of the invention.

FIG. 14 shows an embodiment of a mask layout 100 comprising electrically insulated sections 322 of the opaque second layer 32 that are insulated from each other and from the regions 321 by the transparent separating structure 200. The hatchings of FIG. 14 are as according to FIG. 1. A separating groove 251 may be provided in the second layer 32, the transparent separating groove 251 enclosing the sections 322. This transparent separating groove 251 may insulate large conductive portions 321 that are formed in the second layer from the sections 322. As a result, the sections 322 as well as the separating structure 200 are enclosed by a conductive ring that may, for example, have a width of a 8 mm. This ring may be partitioned by inserting further transparent interrupting regions 252 in the second layer 322 to form small partitions 421, whereby a charging of the ring will be reduced. The separating groove 251 and the interrupting regions 252 may have dimensions so that they are not printed onto the substrate. Alternatively, they may be formed such that they will be printed onto the substrate. In such a case, they could be disposed such that they will not affect the function of the printed components. The interrupting regions 252 may have a width of up to 1 µm or may comprise several smaller interrupting regions. They may be evenly a distributed or may concentrate in the vicinity of corners.

Figure 15:
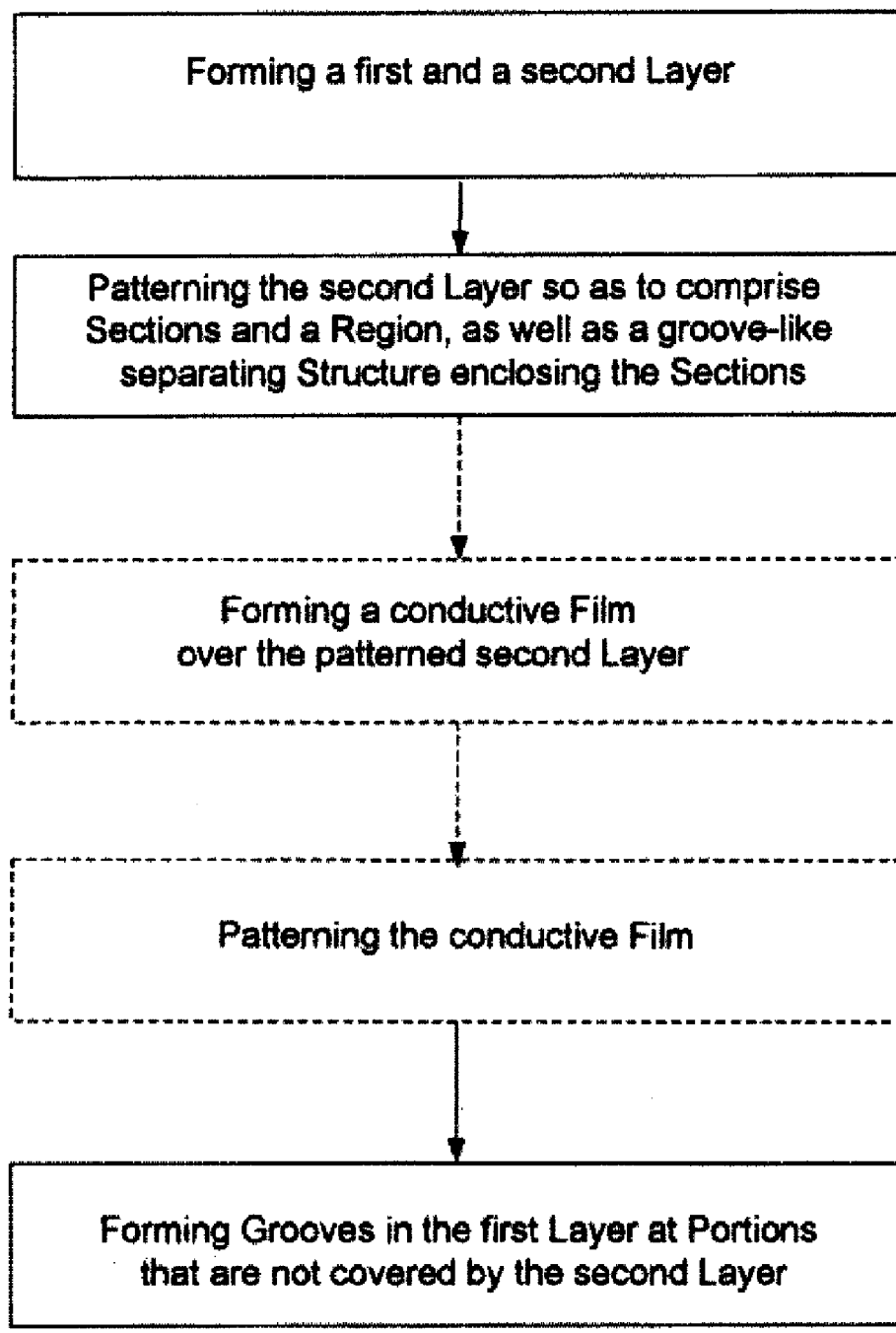
FIG. 15 is a process flow diagram of a method according to an exemplary embodiment of the invention.

FIG. 15 illustrates a method of manufacturing a lithographic mask. The method may comprise forming a first and second layer so that the second layer is disposed over the first layer, patterning the second layer so as to comprise sections and a region, as well as a groove-like structure enclosing the sections, forming grooves in the first layer at portions that are not covered by the second layer, wherein the layers are formed such that potential differences within the second layers are reduced during a process of forming the grooves in the first layer.

According to an exemplary embodiment, the method may further comprise forming a conductive film over the patterned second layer before forming the grooves in the first layer, and patterning the conductive film to form an opening at a position at which the grooves are to be formed. Due to the presence of the conductive layer, portions of the second layer that are insulated from each other will be electrically connected and potential differences in the second layer will be compensated. After patterning the first layer, the conductive layer may be removed. For example, if an alternating phase shift mask is to be formed, the first layer may comprise quartz into which the phase shifting grooves will be formed, for example by way of a dry etching method, in the second processing layer. In a half-tone mask, the first layer may comprise a semitransparent material such as molybdenum silicide that will be patterned in the second processing layer.

According to a further exemplary embodiment, a method of forming a lithographic mask may comprise etching grooves into a first layer and forming the transparent separating structure that encloses the sections of the second layer. The transparent separating structure may be formed after etching the grooves into the first layer. Thereby, potential differences that occur in the second layer during the second processing layer in which the grooves are etched into the first layer, may be avoided. For example, patterning the separating structure that encloses the sections, which may be formed as a barrier structure in the semiconductor wafer, will be patterned in a further processing layer according to this embodiment.

While embodiments of the invention have been described above, further embodiments may be implemented. Accordingly, this spirit and scope of the appended claims should not be limited to the description of the embodiments contained herein.

The invention claimed is:

1. A lithographic mask, comprising:
    a first layer including grooves; and
    a second layer including a region, sections, and a groove-like structure enclosing the sections, the groove-like structure being formed to separate the sections and the region, wherein the second layer is formed over the first layer, and the region at least partially encloses the groove-like structure.

2. The lithographic mask according to claim 1, wherein:
    the first and second layers are of materials selected to avoid electrical potential differences between the sections and the region.

3. The lithographic mask according to claim 2, wherein the first layer is of a conductive material.

4. The lithographic mask according to claim 1, wherein the second layer is of an insulating material.

5. The lithographic mask according to claim 4, wherein the first and the second layer are of an insulating material.

6. The lithographic mask according to claim 1,
    the groove-like structure is formed to avoid potential differences between the sections and the regions within the second layer.

7. The lithographic mask according to claim 6, wherein the groove-like structure formed in the second layer is discontinuous and is adapted to be printed as a continuous structure.

8. The lithographic mask according to claim 7, wherein:
    the second layer is of a first material; and
    the groove-like structure comprises at least two segments isolated from each other by at least one non-printing interrupting region, the at least one non-printing interrupting region being of the first material.

9. The lithographic mask according to claim 8, wherein the segments comprise first segments having a line-shape and at least one end portion, the at least one end portion having a broadening region.

10. The lithographic mask according to claim 9, wherein:
the first segments comprise two neighboring first segments with respective broadening regions; and
the interrupting region is disposed between the two broadening regions of the two neighboring first segments, the broadening regions and the interrupting region having a shape operable to compensate for one another when being imaged onto a substrate.

11. The lithographic mask according to claim 9, wherein the one of the first and second segments is shaped and disposed to have a printed pattern in the shape of a line.

12. The lithographic mask according to claim 8, wherein:
the second layer comprises a first pattern disposed within the section and a second pattern disposed outside the section; and
the groove-like structure, after being imaged onto a substrate, is operable to form a barrier layer protecting the first pattern.

13. The lithographic mask according to claim 6, wherein the groove-like structure in the second layer is non-continuous.

14. The lithographic mask according to claim 13, wherein:
the second layer is of a given material; and
the groove-like structure comprises at least two groove-like segments isolated from each other by at least one printing interrupting region of the given material of the second layer.

15. The lithographic mask according to claim 14, wherein:
the second layer comprises a first pattern disposed within the section and a second pattern disposed outside the section; and
the groove-like structure comprises corners and the printing interrupting region is disposed at a distance from at least one of the corners.

16. The lithographic mask according to claim 1, further comprising a separating groove and interrupting regions in the second layer, the separating groove and the interrupting regions separating the sections and at least one of the regions.

17. A lithographic mask, comprising:
a first layer including grooves; and
a second layer including a region, sections, and a groove enclosing the sections, the second layer being formed over the first layer, wherein the region encloses the groove.

18. A method of forming a lithographic mask, which comprises:
forming first and second layers to have the second layer disposed over the first layer;
patterning the second layer to comprise sections, a region, and a groove-like structure enclosing the sections, the region at least partially enclosing the groove-like structure;
forming grooves in the first layer at portions not covered by the second layer; and
the first and second layers being formed to reduce potential differences within the second layers while forming the grooves in the first layer.

19. The method according to claim 18, wherein materials of the first and second layers are selected to reduce electrical potential differences between the sections and the region of the second layer.

20. The method according to claim 18, which further comprises:
forming a conductive film over the patterned second layer before forming the grooves in the first layer; and
patterning the conductive film to form an opening at a position at which the grooves are to be formed.

21. The method according to claim 18, wherein the groove-like structure is formed in the second layer after forming the grooves in the first layer.

22. The method according to claim 18, wherein the first layer is formed of a conductive material.

23. The method according to claim 18, wherein the groove-like structure is formed using a beam writing process.

* * * * *